United States Patent [19]

Cabot

[11] Patent Number: 4,560,957
[45] Date of Patent: Dec. 24, 1985

[54] OSCILLATOR FINE TUNE CIRCUIT

[75] Inventor: Richard C. Cabot, Beaverton, Oreg.

[73] Assignee: Tektronix, Inc., Beaverton, Oreg.

[21] Appl. No.: 537,310

[22] Filed: Sep. 29, 1983

[51] Int. Cl.$^4$ .......................... H03B 5/24; H03F 1/34
[52] U.S. Cl. .................................... 331/135; 331/34; 330/109
[58] Field of Search .................. 331/34, 135, 175, 179, 331/177 R; 330/107, 109, 304, 310

[56] References Cited

U.S. PATENT DOCUMENTS 4,145,670  3/1979  Bode .................................... 331/135

Primary Examiner—Eugene R. LaRoche
Assistant Examiner—G. Wan
Attorney, Agent, or Firm—William A. Birdwell

[57] ABSTRACT

An oscillator having a circuit for fine tuning the frequency thereof while minimizing any effect on the output amplitude thereof. A state variable oscillator employs an inverter amplifier having a negative feedback resistor $R_f$, a first integrator, and a second integrator. 180° feedback from the second integrator is fed back through resistors $R_i$ and $R_v$ to an inverting input of the inverter amplifier. 90° feedback from the first integrator is fed back partially through resistors $R_n$ and $R_v$ and partially through resistor $R_m$ to the inverting input, and also through resistor $R_c$ to the non-inverting input. A field effect transistor provides a common return to the non-inverting input to control oscillator amplitude. If $R_i R_m = R_n R_f$ then $R_v$ may be adjusted to vary the frequency of the oscillator output signal without affecting its amplitude.

4 Claims, 2 Drawing Figures

OSCILLATOR FINE TUNE CIRCUIT

BACKGROUND OF THE INVENTION

The present invention relates to state variable, sine wave oscillators, and particularly to such oscillators employing circuits for fine tuning the frequency thereof.

A commonly known oscillator topology is the state variable oscillator in which the oscillator circuit provides an analog solution to a second order differential equation resulting in a sinusoidal output signal. The differential equation takes the following form:

$$a\frac{d^2V}{dt^2} + b\frac{dV}{dt} + cV = 0$$

The instantaneous amplitude of the oscillator signal is represented by the term V; the constants a, b, and c establish the frequency of the oscillator signal. Such circuits typically employ an inverter amplifier stage followed by first and second consecutive integrating amplifier stages, the output from the second integrator being fed back to an inverting input of the inverter stage, and the output from the first integrator being fed back to the inverting and a non-inverting input of the inverter stage, each of the stages comprising operational amplifiers having associated corresponding input and feedback impedances. The state variables are a function of input and feedback resistor and capacitor values used in the amplifier and integrator stages. Oscillation occurs at the frequency at which there is unity gain in the feedback loop from the second integrator to the inverter, while the amplitude of the oscillator output is determined by the gain in the feedback loop from the first integrator to the inverter.

Non-ideal characteristics of real amplifiers and capacitors cause the amplitude of the oscillator output to be unstable and unpredictable, in the absence of external control. Leveling of the amplitude is typically accomplished by a field effect transistor in the first stage of the oscillator, the field effect transistor controlling the gain of a non-inverting input to that stage in response to an ancillary leveling circuit which monitors the oscillator output amplitude. While the gross frequency adjustment of such an oscillator is accomplished by changing the resistor and capacitor values of the integrator stages, fine tuning of the oscillator is typically accomplished by varying the input resistor value to the inverting input of the first stage from the output of the second stage, thereby changing the inverter gain experienced by that feedback loop and, hence, the frequency at which the oscillator experiences unity loop gain.

Unfortunately, fine tuning of the frequency by adjusting the input gain of the inverter stage also affects the gain experienced by the feedback from the first integrator through the non-inverting input of the inverter stage and, hence, the amplitude of the oscillator output signal. Although such variations in amplitude would ultimately be corrected by the leveling circuit, variations in the gain for purposes of tuning which occur faster than the bandwidth of the leveling circuit will result in amplitude modulation of the oscillator output, which is undesirable. Thus, there is a need for a state variable oscillator circuit that will permit fine tuning of the frequency of the oscillator without affecting the oscillator output amplitude.

SUMMARY OF THE INVENTION

The present invention solves the aforementioned problem by providing an inverter input resistor network for a state variable oscillator that allows the gain experienced by the feedback from the second integrator to be adjusted without affecting the gain experienced by the feedback from the first integrator. This is accomplished by splitting the feedback signal from the first integrator into two portions, one of which flows through a first inverting input resistor preceding a frequency adjustment resistor whose resistance is varied to adjust the gain experienced by the feedback from the second integrator. The second portion flows directly through a second inverting input resistor to the inverting input of the inverter stage. The frequency adjustment resistor is preceded in the second integrator feedback loop by a fixed resistor. It can be shown that if the resistance values are chosen so as to satisfy the equation $$R_i R_m = R_n R_f$$

where:
$R_i$ = the value of the fixed resistor in the second integrator feedback loop;
$R_f$ = the value of the feedback resistor in the inverter stage;
$R_n$ = the value of the first inverting input resistor; and
$R_m$ = the value of the second inverting input resistor the frequency adjustment resistor may be varied to fine tune the oscillator without affecting the oscillator amplitude.

It is therefore a principal objective to provide a novel circuit for fine tuning the frequency of an oscillator without affecting the output amplitude thereof.

It is another objective of the invention to provide such a circuit which employs a resistor network with resistors having values selected according to a predetermined mathematical relationship.

It is yet a further objective to provide a state variable oscillator which employs such a fine tune circuit.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
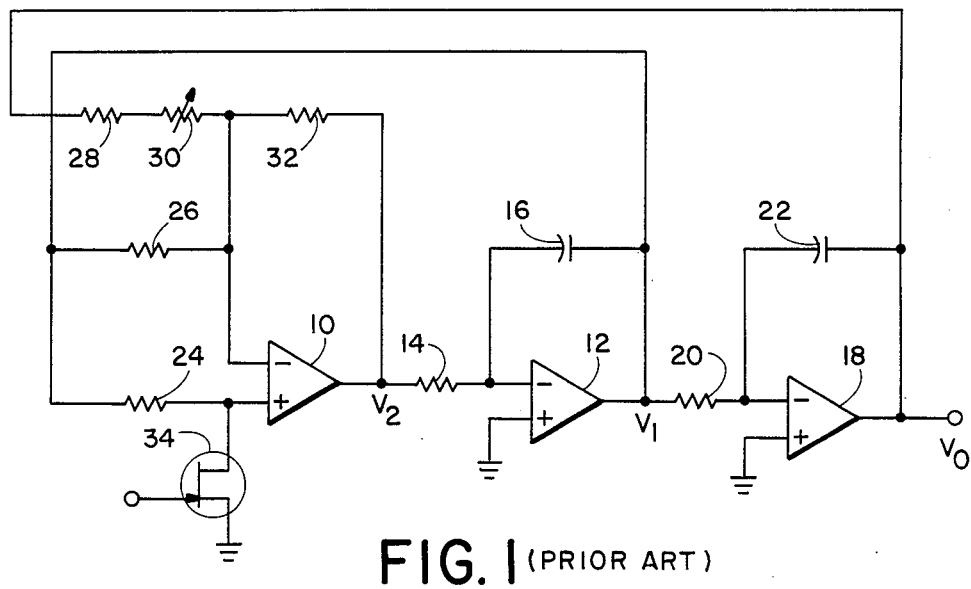
FIG. 1 is a simplified schematic diagram illustrating a prior art state variable oscillator.

Referring to FIG. 1, a typical prior art state variable, sine wave oscillator employs an inverter stage having an inverter amplifier 10, a first integrator stage having an integrater amplifier 12, an input resistor 14, and a feedback capacitor 16, and a second integrator stage having an integrator amplifier 18, an input resistor 20, and a feedback capacitor 22. The output $V_1$ from the first integrator, which is shifted 90° from the input thereof, is fed back to the non-inverting input of the amplifier 10 through resistor (having resistance $R_a$) 24 and to the inverting input through resistor (having resistance $R_b$) 26. The output $V_o$ of the second integrator, which is shifted 180° from the output of the inverter amplifier, is fed back to the inverting input of the amplifier 10 through resistor (having resistance $R_c$) 28 and variable resistor (having resistance $R_v$) 30. The output $V_2$ from the amplifier 10 is fed back to its inverting input through resistor (having resistance $R_f$) 32 to its inverting input. Leveling of the amplitude is controlled by the field effect transistor ("FET") 34 (having an effective resistance $R_t$).

In such a circuit the gains experienced by the signals fed back from the first and second integrators to the inverter stage are determined as follows:

$$G_{1+} = \left[ 1 + \frac{R_f}{(R_c + R_v) | |R_b} \right] \left[ \frac{R_t}{R_a + R_t} \right]$$

$$G_{1-} = - \frac{R_f}{R_b}$$

$$G_o = - \frac{R_f}{R_b + R_v}$$

where:
$G_{1+}$ = the gain experienced by the feedback signal from the first integrator (90° feedback) through the non-inverting input;
$G_{1-}$ = the gain experienced by the feedback signal from the first integrator through the inverting input; and
$G_o$ = the gain experienced by the feedback signal from the second integrator (180° feedback).

The frequency of the oscillator is determined by the values of resistor 14, capacitor 16, resistor 20, capacitor 22, and the gain $G_o$ experienced by the 180° feedback through the inverter stage, oscillation occurring at the frequency that results in unity loop gain. The amplitude of the oscillator output $V_o$ is determined by the gain experienced by the 90° feedback through the inverter stage, which may be positive or negative depending upon the resistances of $R_v$ and $R_t$.

While $R_v$ may be adjusted to fine tune the frequency of the oscillator by changing the gain experienced by the 180° feedback, it can be seen from the foregoing equations that it will also change the gain experienced by the 90° feedback and consequently require the leveling circuit to make an adjustment in order to maintain a given oscillator amplitude. Due to the time required for the leveling circuit to make the adjustment, amplitude modulation is thereby introduced.

Figure 2:
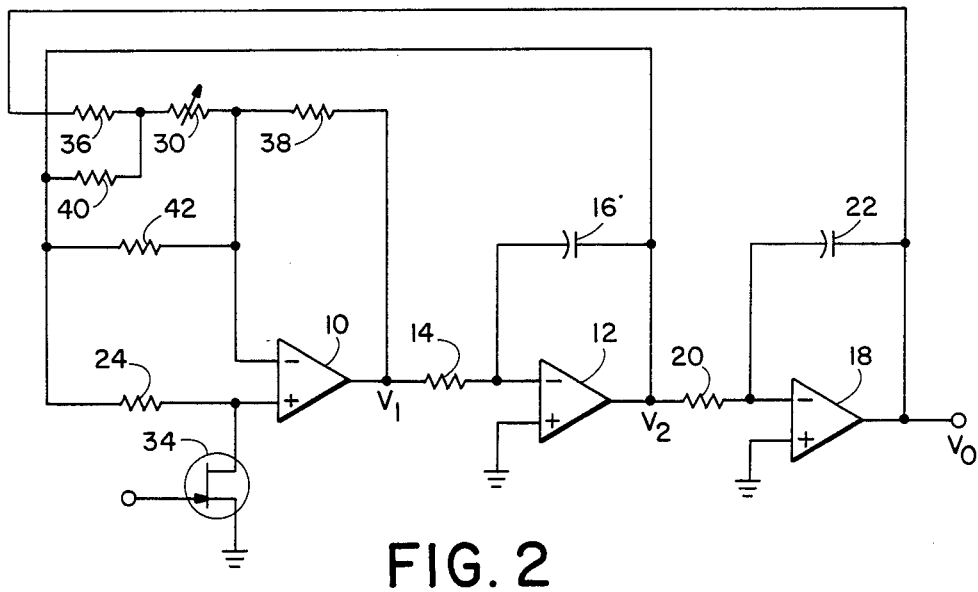
FIG. 2 is a simplified schematic diagram of a state variable oscillator employing the fine tune circuit of the present invention.

Referring now to FIG. 2, in the present invention the resistor network comprising the input and feedback resistances of the inverter amplifier 10 include a fixed input resistor (having resistance $R_i$) 36, a feedback resistor (having resistance $R_f$) 38, and the variable resistor ($R_v$) 30. The 90° feedback noninverting input is split between a first resistor (having resistance $R_n$) 40 and a second resistor (having resistance $R_m$) 42 bracketing the variable resistor 40. It has been found that with this structure varying the resistance of the variable resistor 30 has less effect on the amplitude of the oscillator output signal and the effect is opposite to that which occurs as a result of changing the variable resistor in the aforementioned prior art circuit.

In the oscillator of FIG. 2, the gains experienced by the signals fed back from the first and second integrators to the inverter stage are determined as follows:

$$G_{1+} = \left[ 1 + \frac{R_f}{R_m | |(R_v + R_i| |R_n)} \right] \left[ \frac{R_t}{R_a + R_t} \right]$$

$$G_{1-} = - \frac{R_f}{\left[ R_n + R_v + \frac{R_n R_v}{R_i} \right] | |R_m}$$

$$G_o = - \frac{R_f R_n}{R_i R_n + R_v R_n + R_i R_v} \approx - \frac{R_f}{R_i + R_v}$$

Assuming that the net gain experienced by the 90° feedback signal through the inverter stage ($G_1$) is to remain constant, it can be shown that $$R_i R_m = R_n R_f.$$

Thus, if $R_i$, $R_m$, $R_n$, and $R_f$ are chosen according to the foregoing equation, changes in the variable resistor 30 will have no effect on the output amplitude.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:
1. A fine tune circuit for use in a state variable oscillator having a first stage comprising an amplifier, a feedback resistor $R_f$ connected between the amplifier output and an inverting input thereof, a variable resistor $R_v$ connected between said inverting input and a first node, said variable resistor controlling the frequency of said oscillator, and a resistor connected between a non-inverting in put of said amplifier and a second node, a second, integrating stage, and a third, integrating stage, said circuit comprising:
   (a) a resistor $R_i$ connected between said first node and a third node;
   (b) a resistor $R_n$ connected between said first and second nodes; and
   (c) a resistor $R_m$ connected between said inverting input and said second node,
feedback from said second stage being applied to said second node and feedback from said third stage being applied to said third node.

2. The circuit of claim 1 wherein $R_i R_m = R_n R_f$.

3. A state variable oscillator, comprising:
   (a) an inverter amplifier having an inverting input, a non-inverting input, an output, and a feedback resistor $R_f$ connected between said output and said inverting input;
   (b) a first integrator having an inverting input connected to the output of said inverter amplifier, a non-inverting input, and an output;
   (c) a second integrator having an inverting input connected to the output of said first integrator, a non-inverting input, and an output;
   (d) resistance means, connected between the non-inverting input of said inverter amplifier and the non-inverting inputs of said first and second integrators, for varying the resistance therebetween in response to a control signal;

(e) a frequency control resistor $R_v$ connected between the inverting input of said inverter amplifier and a node;

(f) means associated with said frequency control resistor for changing the resistance thereof;

(g) a resistor $R_a$ connected between the output of said first integrator and the non-inverting input of said inverter amplifier;

(h) a resistor $R_m$ connected between the output of said first integrator and the inverting input of said inverter amplifier;

(i) a resistor $R_i$ connected between the output of said second integrator and said node; and (j) a resistor $R_n$ connected between the output of said first integrator and said node.

4. The oscillator of claim 1 wherein $R_i R_m = R_n R_f$.

* * * * *